United States Patent
Tominaga (10) Patent No.: US 11,458,722 B2
(45) Date of Patent: Oct. 4, 2022

(54) THREE-DIMENSIONAL MULTI-LAYER ELECTRONIC DEVICE PRODUCTION METHOD

(71) Applicant: FUJI CORPORATION, Chiryu (JP)

(72) Inventor: Ryojiro Tominaga, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 258 days.

(21) Appl. No.: 16/760,580

(22) PCT Filed: Nov. 21, 2017

(86) PCT No.: PCT/JP2017/041814
§ 371 (c)(1),
(2) Date: Apr. 30, 2020

(87) PCT Pub. No.: WO2019/102522
PCT Pub. Date: May 31, 2019

(65) Prior Publication Data
US 2020/0346452 A1    Nov. 5, 2020

(51) Int. Cl.
*H05K 3/02*  (2006.01)
*B33Y 10/00*  (2015.01)
*B33Y 50/02*  (2015.01)
*H05K 3/46*  (2006.01)

(52) U.S. Cl.
CPC .............. *B33Y 10/00* (2014.12); *B33Y 50/02* (2014.12); *H05K 3/46* (2013.01)

(58) Field of Classification Search
CPC ...... H01L 2224/16145; H01L 25/0657; H05K 3/4611; H05K 1/186; H05K 3/46; H05K 3/4697; H05K 7/023; Y10T 29/49126; Y10T 29/49117; Y10T 29/5313; Y10T 29/4913; Y10T 29/49155

USPC ......... 29/846, 825, 830, 832, 834, 837, 841, 29/852
See application file for complete search history.

(56) References Cited

U.S. PATENT DOCUMENTS

| | | |
|---|---|---|
| 5,663,883 A | 9/1997 | Thomas et al. |
| 6,625,037 B2 * | 9/2003 | Nakatani ................ H05K 1/187 |
| | | 257/E23.125 |
| 7,479,794 B2 * | 1/2009 | Chartarifsky ...... G01R 1/07342 |
| | | 324/755.05 |
| 2003/0060172 A1 | 3/2003 | Kuriyama et al. |

(Continued)

FOREIGN PATENT DOCUMENTS

| | | |
|---|---|---|
| JP | 09-199526 A | 7/1997 |
| JP | 11-514304 A | 12/1999 |

(Continued)

OTHER PUBLICATIONS

International Search Report dated Feb. 13, 2018 in PCT/JP2017/041814 filed Nov. 21, 2017.

*Primary Examiner* — Thiem D Phan
(74) *Attorney, Agent, or Firm* — Oblon, McClelland, Maier & Neustadt, L.L.P.

(57) ABSTRACT

Disclosed is a method of manufacturing a three-dimensional multi-layer electronic device, the method including: a unit forming process of forming a multi-layer unit including an electronic component and a circuit wiring by three-dimensional lay-out forming; and a unit lay-out process of manufacturing a three-dimensional multi-layer electronic device by laying out and integrating the multi-layer unit in a vertical direction.

5 Claims, 8 Drawing Sheets

(56) References Cited

U.S. PATENT DOCUMENTS

| | | |
|---|---|---|
| 2004/0145629 A1 | 7/2004 | Silverbrook |
| 2007/0035015 A1 | 2/2007 | Hsu |
| 2016/0242296 A1 | 8/2016 | Deangelis |
| 2017/0280567 A1 | 9/2017 | Suzuki et al. |

FOREIGN PATENT DOCUMENTS

| | | |
|---|---|---|
| JP | WO2016/042657 A1 | 3/2016 |
| JP | 2017-135364 A | 8/2017 |

* cited by examiner

THREE-DIMENSIONAL MULTI-LAYER ELECTRONIC DEVICE PRODUCTION METHOD

TECHNICAL FIELD

The present disclosure relates to a method of manufacturing a three-dimensional multi-layer electronic device using three-dimensional lay-out forming, and a three-dimensional multi-layer electronic device.

BACKGROUND ART

Conventionally, various technologies related to three-dimensional lay-out forming have been proposed.

For example, a technology disclosed in Patent Literature 1 is a high-speed prototype forming method, including: a. a process of electrolyzing an object into relatively thick multiple layers; b. a process of electrically slicing the multiple layers into multiple cross-sections corresponding to the thickness of an assembly material sheet; and c. a process of drawing, on a sheet, a physical section of the assembly material corresponding the cross-sections. The high-speed prototype forming method further includes: d. a process of slicing the physical sections from the assembly material sheet; e. a process of laying out the physical sections to assemble the layers; and f. a process of reforming a physical model of the object by laying out the layers.

PATENT LITERATURE

Patent Literature 1: JP-T-H11-514304

BRIEF SUMMARY

Technical Problem

The technology disclosed in Patent Literature 1 can avoid sequentially forming layers, for example, one by one at one time. However, since the technology relates to a prototype modeling technology, it is difficult to apply the technology to manufacturing of a three-dimensional multi-layer electronic device. Further, when a component is built in a cavity by a full additive method, it is complicated to consider a dimensional variation of the built-in component. This is because it is necessary to adjust the dimension of a cavity one by one according to a component variation, and further to adjust the amount of a resin embedded in the cavity.

The present disclosure has been made in view of the above-described points, and an object of the present disclosure is to provide a method of manufacturing a three-dimensional multi-layer electronic device and a three-dimensional multi-layer electronic device that can reduce a tact time and a cycle time. Further, another object of the present disclosure is to provide a method of manufacturing a three-dimensional multi-layer electronic device and a three-dimensional multi-layer electronic device that can have a high tolerance for a dimensional variation of embedded electronic components.

Solution to Problem

The present specification discloses a method of manufacturing a three-dimensional multi-layer electronic device, the method including: a unit forming process of forming a multi-layer unit including an electronic component and a circuit wiring by three-dimensional lay-out forming; and a unit lay-out process of manufacturing a three-dimensional multi-layer electronic device by laying out the multi-layer units integrally in a vertical direction.

Advantageous Effects

According to the present disclosure, a method of manufacturing a three-dimensional multi-layer electronic device can shorten a tact time and a cycle time. Further, according to the present disclosure, it is possible to have a high tolerance for dimensional variations of built-in electronic components.

DESCRIPTION OF EMBODIMENTS

Hereinafter, preferred embodiments of the present disclosure will be described in detail with reference to the drawings.

(A) Configuration of Multi-Layer Unit Forming Device

Figure 1:
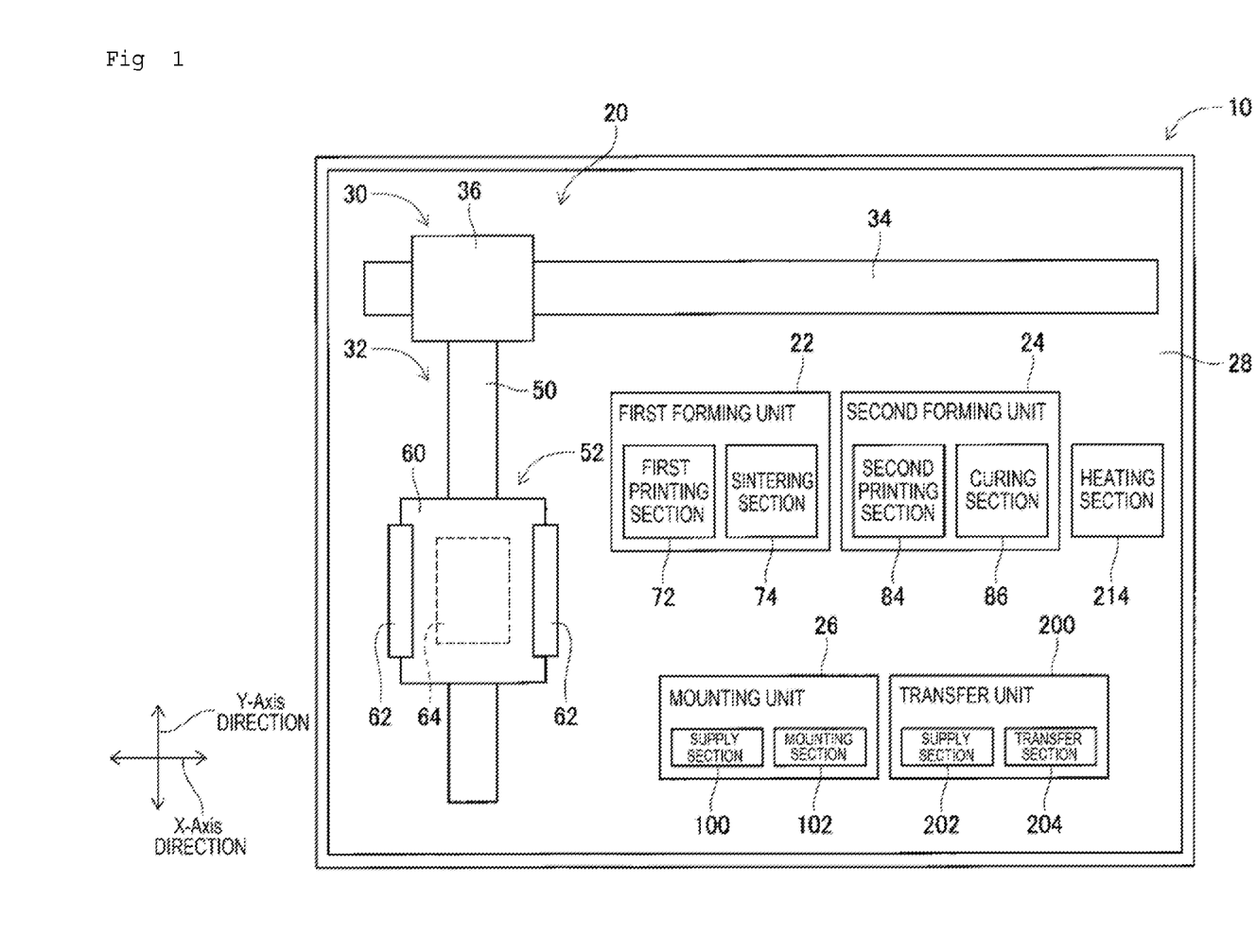
FIG. 1 is a diagram illustrating a multi-layer unit forming device.

FIG. 1 illustrates multi-layer unit forming device 10. Multi-layer unit forming device 10 includes conveying device 20, first forming unit 22, second forming unit 24, mounting unit 26, and control device (see FIGS. 2 and 3) 27. Multi-layer unit forming device 10 further includes transfer unit 200 and heating section 214. Conveying device 20, first forming unit 22, second forming unit 24, mounting unit 26, transfer unit 200, and heating section 214 are arranged on base 28 of multi-layer unit forming device 10. Base 28 has a rectangular shape in general, and in the following description, the longitudinal direction of base 28 is referred to as an X-axis direction, the short-side direction of base 28 is referred to as a Y-axis direction, and a direction orthogonal to both the X-axis direction and the Y-axis direction is referred to as a Z-axis direction.

Conveying device 20 includes X-axis slide mechanism 30 and Y-axis slide mechanism 32. X-axis slide mechanism 30 includes X-axis slide rail 34 and X-axis slider 36. X-axis slide rail 34 is disposed on base 28 to extend in the X-axis direction. X-axis slider 36 is slidably held in the X-axis direction by X-axis slide rail 34. Further, X-axis slide mechanism 30 has electromagnetic motor (see FIG. 2) 38, and X-axis slider 36 is moved to a predetermined position in the X-axis direction by driving electromagnetic motor 38. Further, Y-axis slide mechanism 32 has Y-axis slide rail 50 and stage 52. Y-axis slide rail 50 is disposed on base 28 to extend in the Y-axis direction. One end of Y-axis slide rail 50 is connected to X-axis slider 36. Therefore, Y-axis slide rail 50 is movable in the X-axis direction. Stage 52 is held on Y-axis slide rail 50 to be slidable in the Y-axis direction. Further, Y-axis slide mechanism 32 has electromagnetic motor (see FIG. 2) 56, and stage 52 is moved to a predetermined position in the Y-axis direction by driving electromagnetic motor 56. Accordingly, stage 52 is moved to a predetermined position on base 28 by driving X-axis slide mechanism 30 and Y-axis slide mechanism 32.

Stage 52 includes base 60, holding devices 62, and lifting and lowering device 64. Base 60 is formed in a flat plate shape, and base material (see FIG. 5) 70 is placed on the upper surface of base 60. Holding devices 62 are provided on both sides of base 60 in the X-axis direction. Both edge portions of base material 70 placed on base 60 in the X-axis direction are sandwiched by holding devices 62, so that base material 70 is fixedly held. Lifting and lowering device 64 is disposed below base 60, and lifts and lowers 60 in the Z-axis direction.

A material made of a wax-based material (for example, a brazing material) soluble by heat or a solvent is used as base material 70. However, base material 70 is not limited thereto, and may be made of, for example, a strippable base material (for example, a double-sided tape, a film material or the like having a low adhesive force). However, when such a double-sided tape is used as base material 70, base material 70 is fixedly held on base 60 by the adhesive force, and thus, holding devices 62 become unnecessary.

First forming unit 22 is a unit for forming a circuit wiring on base material 70 mounted on base 60 of stage 52, and includes first printing section 72 and sintering section 74. First printing section 72 has inkjet head (see FIG. 2) 76, and linearly ejects metal ink onto base material 70 placed on base 60. The metal ink is obtained by dispersing fine particles of metal in a solvent. Inkjet head 76 ejects metal ink from multiple nozzles by, for example, a piezo method using a piezoelectric element.

Sintering section 74 has laser irradiation device (see FIG. 2) 78. Laser irradiation device 78 is a device for irradiating the metal ink ejected onto base material 70 with a laser beam, and the metal ink irradiated with the laser is sintered to form the circuit wiring. Sintering of the metal ink is a phenomenon in which evaporation of a solvent, decomposition of protective films of metal microparticles, or the like is performed by applying energy, and the metal microparticles contact or are fused with each other, so that conductivity is increased. Then, the metal ink is sintered to form a circuit wiring made of metal.

Further, second forming unit 24 is a unit for forming a resin layer on base material 70 placed on base 60 of stage 52, and includes second printing section 84 and curing section 86. Second printing section 84 includes inkjet head (see FIG. 2) 88, and ejects an ultraviolet curable resin onto base material 70 placed on base 60. The ultraviolet curable resin is a resin that is cured by irradiation with ultraviolet rays. Inkjet head 88 may be, for example, a piezo type using a piezoelectric element, or may be a thermal type in which a resin is heated to generate air bubbles, which are ejected from multiple nozzles.

Curing section 86 includes flattening device (see FIG. 2) 90 and irradiation device (see FIG. 2) 92. Flattening device 90 flattens the upper surface of the ultraviolet curable resin ejected onto base material 70 by inkjet head 88, and for example, scrapes off excess resin by a roller or a blade while smoothening the surface of the ultraviolet curable resin, to make the thickness of the ultraviolet curable resin uniform. Further, irradiation device 92 includes a mercury lamp or an LED as a light source, and irradiates the ultraviolet curable resin ejected onto base material 70 with ultraviolet rays. Accordingly, the ultraviolet curable resin ejected onto base material 70 is cured to form a resin layer.

Further, mounting unit 26 is a unit for mounting first electronic component (see FIG. 7) 96, second electronic component (see FIG. 7) 98, and probe pin (see FIG. 7) 99 on base material 70 placed on base 60 of stage 52, and has supply section 100 and mounting section 102. Supply section 100 has multiple first tape feeders (see FIG. 2) 110 for feeding taped first electronic component 96 one by one and multiple second tape feeders (see FIG. 2) 111 for feeding taped second electronic component 98 one by one, and supplies first electronic component 96 and second electronic component 98 at each supply position. Further, supply section 100 has tray (see FIG. 2) 201 arranged in a state in which probe pin 99 stands up, and supplies probe pin 99 in a state in which probe pin 99 can be picked up from tray 201. The supply of first electronic component 96 and second electronic component 98 is not limited to supply by first tape feeders 110 and second tape feeders 111, but may be supplied by a tray. On the other hand, the supply of probe pin 99 is not limited to supply by tray 201, but may be supply by a tape feeder. Further, first electronic component 96, second electronic component 98, and probe pin 99 may be supplied by both the tape feeder and the tray, or may be supplied by another method.

Mounting section 102 has mounting head (see FIG. 2) 112 and moving device (see FIG. 2) 114. Mounting head 112 has suction nozzle 118 (see FIG. 7) for picking up and holding first electronic component 96, second electronic component 98, or probe pin 99 (hereinafter, referred to as the first electronic component 96 or the like). Suction nozzle 118 picks up and holds first electronic component 96 and the like by picking up air as a negative pressure is supplied from a positive/negative pressure supply device (not illustrated). As a slight positive pressure is supplied from the positive/negative pressure supply device, first electronic component 96 and the like are separated. Further, moving device 114 moves mounting head 112 between each supply position or tray 201 of first tape feeder 110 and second tape feeder 111 and base material 70 placed on base 60. Accordingly, in mounting section 102, first electronic component 96 or the like is held by suction nozzle 118, and first electronic component 96 or the like held by suction nozzle 118 is mounted on base material 70. For example, a sensor element such as a gyro sensor is used as first electronic component 96 or second electronic component 98. Further, probe pin 99 may be a probe pin of which a tip end can be stroked, but such a stroke may not be possible.

Transfer unit 200 is a unit for transferring first conductive adhesive 224 (see FIG. 5) and second conductive adhesive 234 (see FIG. 5) onto base material 70 placed on base 60 of stage 52. First conductive adhesive 224 and second conductive adhesive 234 are conductive pastes that are cured by heating. However, first conductive adhesive 224 is cured by ultraviolet ray before the heating. Irradiation of the ultraviolet rays is performed by irradiation device 92.

Further, transfer unit 200 includes supply section 202 and transfer section 204. Supply section 202 includes first adhesive supply device 206 (see FIG. 3) and second adhesive supply device 208 (see FIG. 3). First adhesive supply device 206 has a dip plate (not illustrated) onto which first conductive adhesive 224 is ejected, and supplies first conductive adhesive 224 in a state in which first conductive adhesive 224 has a uniform thickness by being pushed and spread by a squeegee (not illustrated) in the dip plate. Similarly, second adhesive supply device 208 has a dip plate (not illustrated) onto which second conductive adhesive 234 is ejected, and supplies second conductive adhesive 234 in a state in which second conductive adhesive 234 has a uniform thickness by being extruded and spread by a squeegee (not illustrated) in the dip plate.

Transfer section 204 includes transfer head 210 (see FIG. 3) and moving device (see FIG. 3) 212. Transfer head 210 has multiple dip needles (see FIG. 5) 119 for transferring first conductive adhesive 224 or second conductive adhesive 234. Dip needle 119 is dipped into first conductive adhesive 224 or second conductive adhesive 234 in each dip plate of first adhesive supply device 206 or second adhesive supply device 208. Accordingly, first conductive adhesive 224 or second conductive adhesive 234 adheres to a tip end of dip needle 119. Transfer head 210 uses multiple dip needles 119 separately to which first conductive adhesive 224 is attached and to which second conductive adhesive 234 is attached. Further, transfer device 212 moves transfer head 210 between each dip plate of first adhesive supply device 206 or second adhesive supply device 208 and base material 70 mounted on base 60. Accordingly, in transfer section 204, first conductive adhesive 224 or second conductive adhesive 234 adhering to the tip end of dip needle 119 is transferred onto base material 70.

Heating section 214 has irradiation device (see FIG. 3) 216. Irradiation device 216 includes an infrared lamp or an infrared heater, and irradiates base material 70 with infrared rays. Accordingly, first conductive adhesive 224 or second conductive adhesive 234 transferred onto base material 70 is cured by heating. Heating section 214 may include an electric furnace instead of irradiation device 216.

Figure 2:
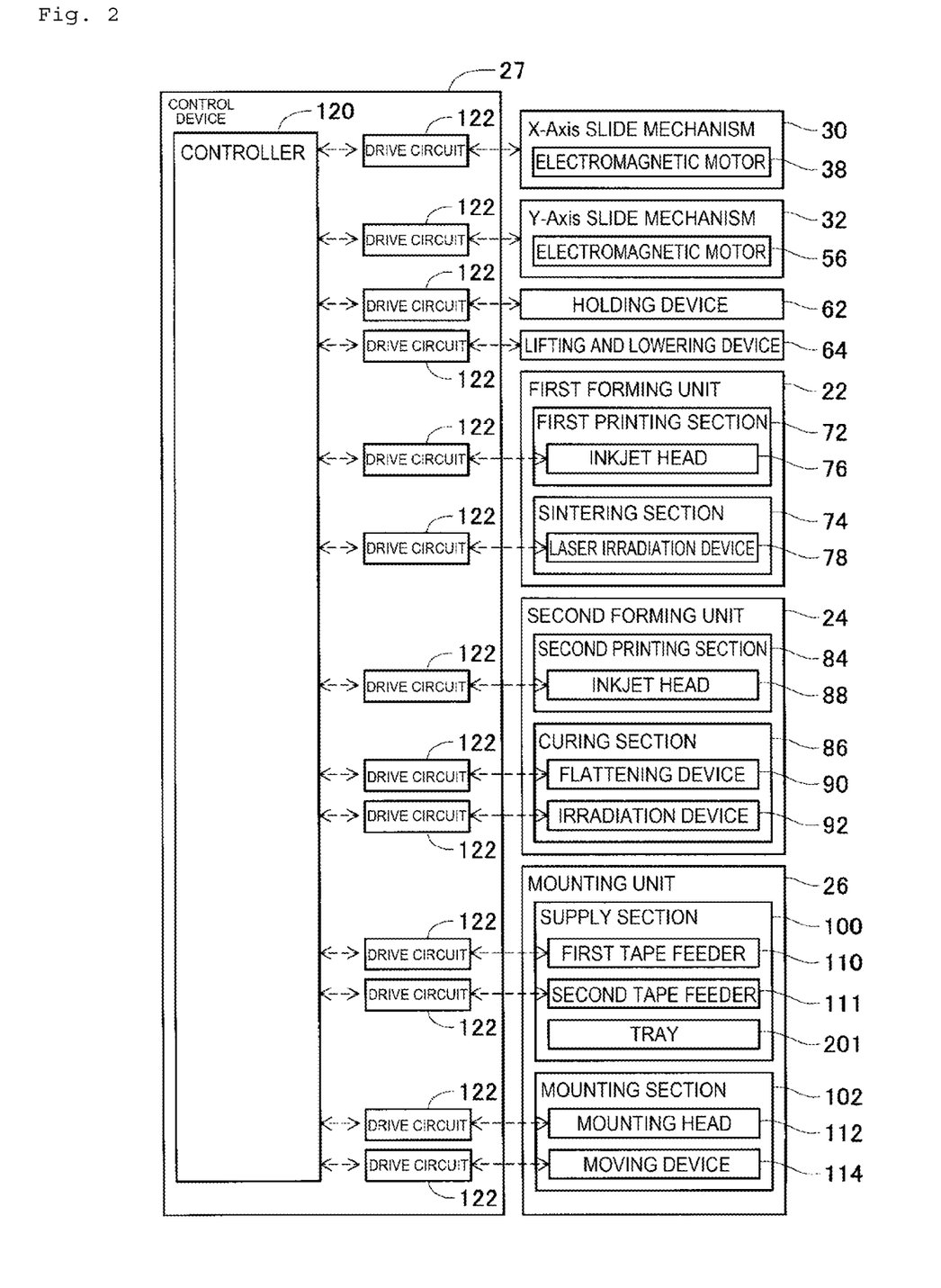
FIG. 2 is a block diagram illustrating a control device.
Figure 3:
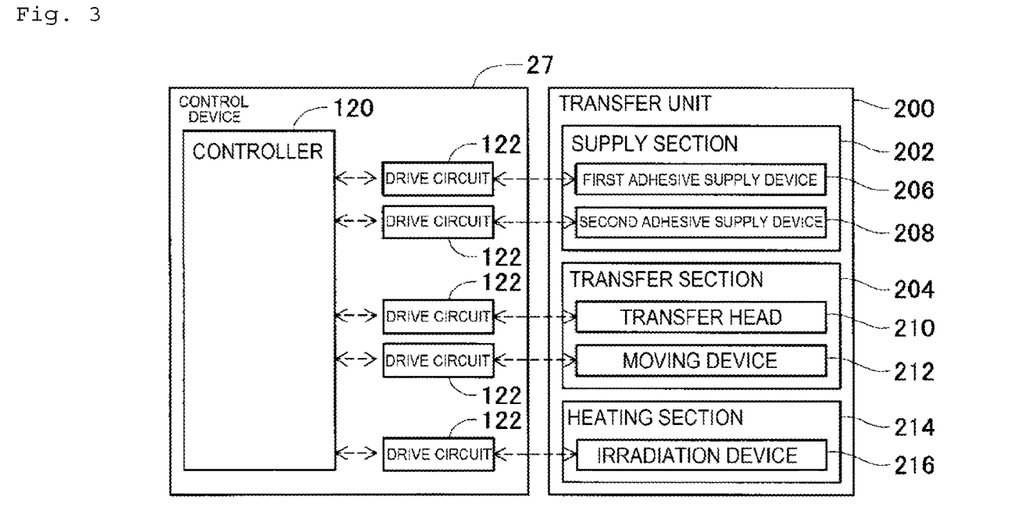
FIG. 3 is a block diagram illustrating the control device.

Further, as illustrated in FIGS. 2 and 3, control device 27 includes controller 120 and multiple driving circuits 122. As illustrated in FIG. 2, multiple driving circuits 122 are connected to electromagnetic motors 38 and 56, holding device 62, lifting and lowering device 64, inkjet head 76, laser irradiation device 78, inkjet head 88, flattening device 90, irradiation device 92, first tape feeder 110, second tape feeder 111, mounting head 112, and moving device 114. Further, as illustrated in FIG. 3, multiple driving circuits 122 are connected to first adhesive supply device 206, second adhesive supply device 208, transfer head 210, moving device 212, and irradiation device 216. Controller 120 includes a CPU, a ROM, a RAM, and the like, mainly includes a computer, and is connected to multiple driving circuits 122. Accordingly, controller 120 controls operations of conveying device 20, first forming unit 22, second forming unit 24, mounting unit 26, transfer unit 200, and heating section 214.

(B) Method of Manufacturing Three-Dimensional Multi-Layer Electronic Device

Figure 4:
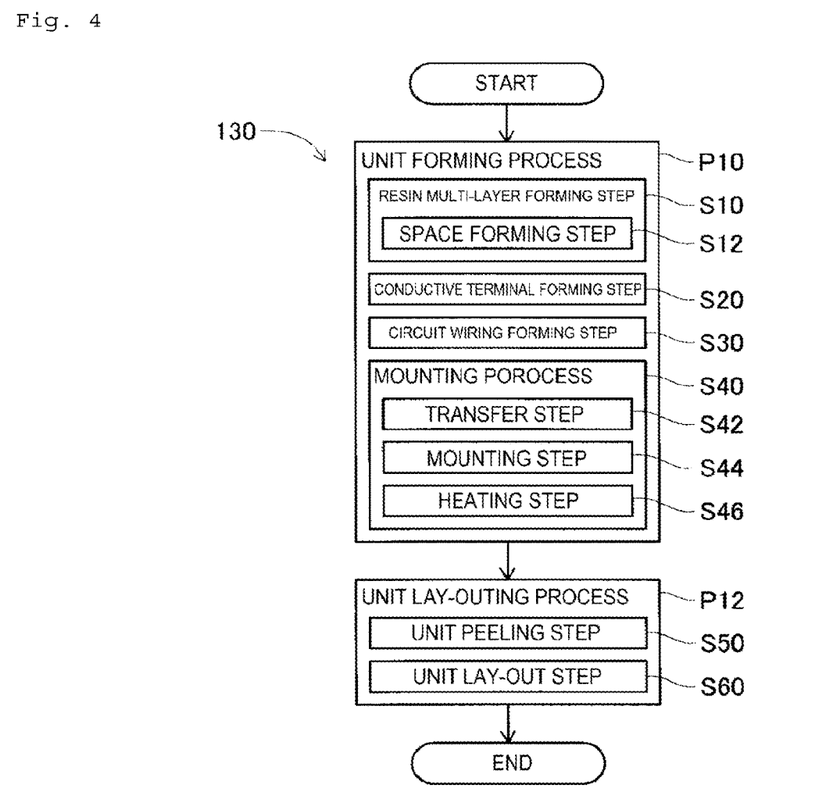
FIG. 4 is a flowchart illustrating flow of a process of manufacturing a three-dimensional multi-layer electronic device.

Next, a method of manufacturing a three-dimensional multi-layer electronic device will be described. As illustrated in FIG. 4, method 130 of manufacturing a three-dimensional multi-layer electronic device includes unit forming process P10 and unit lay-out process P12. In unit forming process P10, multi-layer units 218A, 218B, and 218C (see FIG. 7) are formed on base material 70 by multi-layer unit forming device 10. On the other hand, in unit lay-out process P12, multi-layer units 218A, 218B, and 218C are laid out in a vertical direction, so that three-dimensional multi-layer electronic device 246 (see FIG. 9) is manufactured. In the following description, when respective multi-layer units 218A to 218C are collectively referred without distinction, multi-layer units 218A to 218C are referred to as multi-layer unit 218.

(B-1) Unit Forming Step

Figure 6:
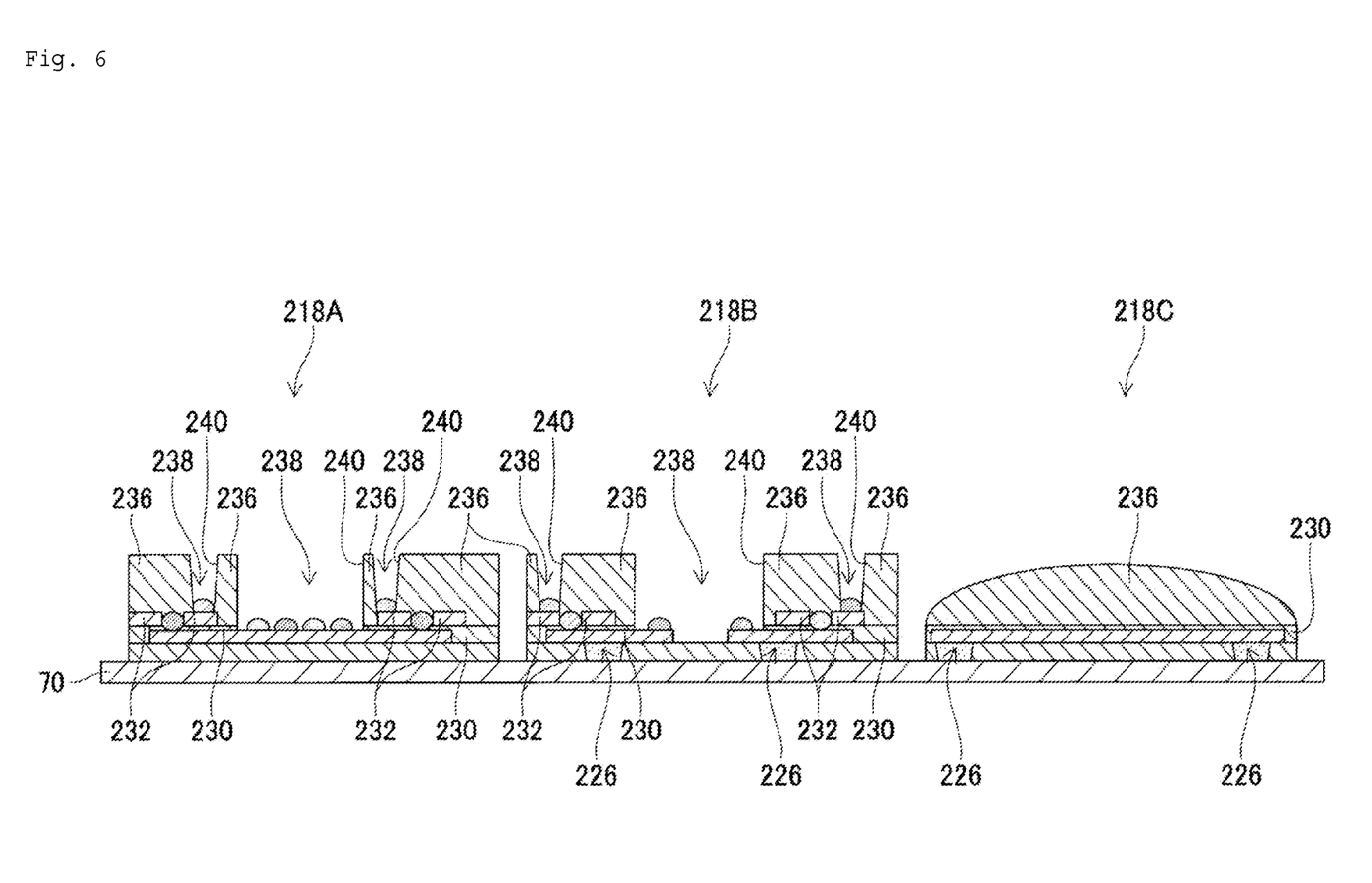
FIG. 6 is a cross-sectional view illustrating each multi-layer unit formed on the base material.
Figure 7:
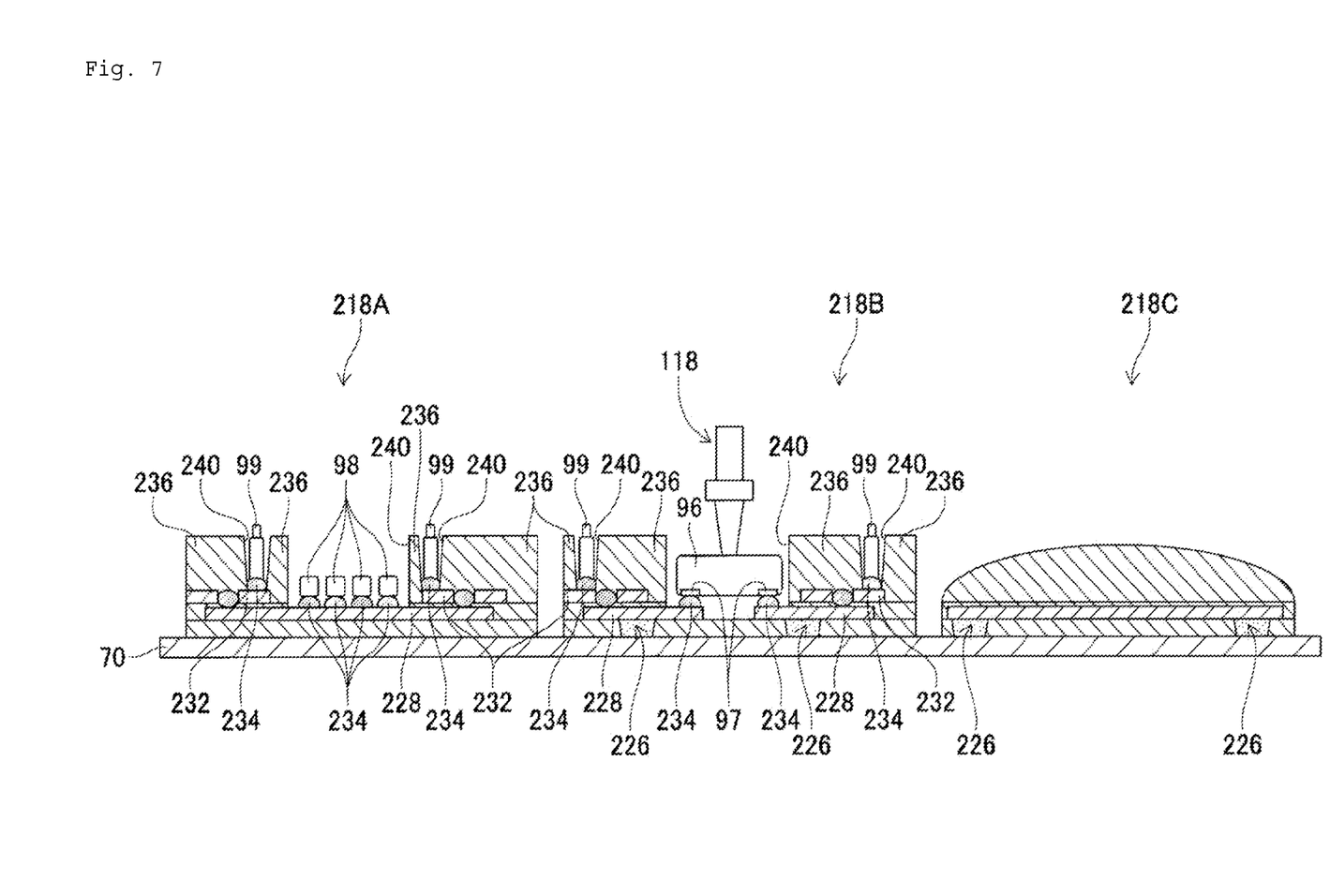
FIG. 7 is a cross-sectional view illustrating the multi-layer unit formed on the base material.

Unit forming process P10 is executed by controller 120, and includes resin multi-layer forming process S10, conductive terminal forming process S20, circuit wiring forming process S30, and mounting process S40. An order of execution of steps S10, S20, S30, and S40 is determined by a multi-layer structure or the like of three-dimensional multi-layer electronic device 246 (that is, each of multi-layer units 218A to 218C). Therefore, steps S10, S20, S30, and S40 are not repeated in a notation order. In the following description, unit lay-out process P12 when each of multi-layer units 218A to 218C illustrated in FIGS. 5 to 7 is formed will be described.

Figure 5:
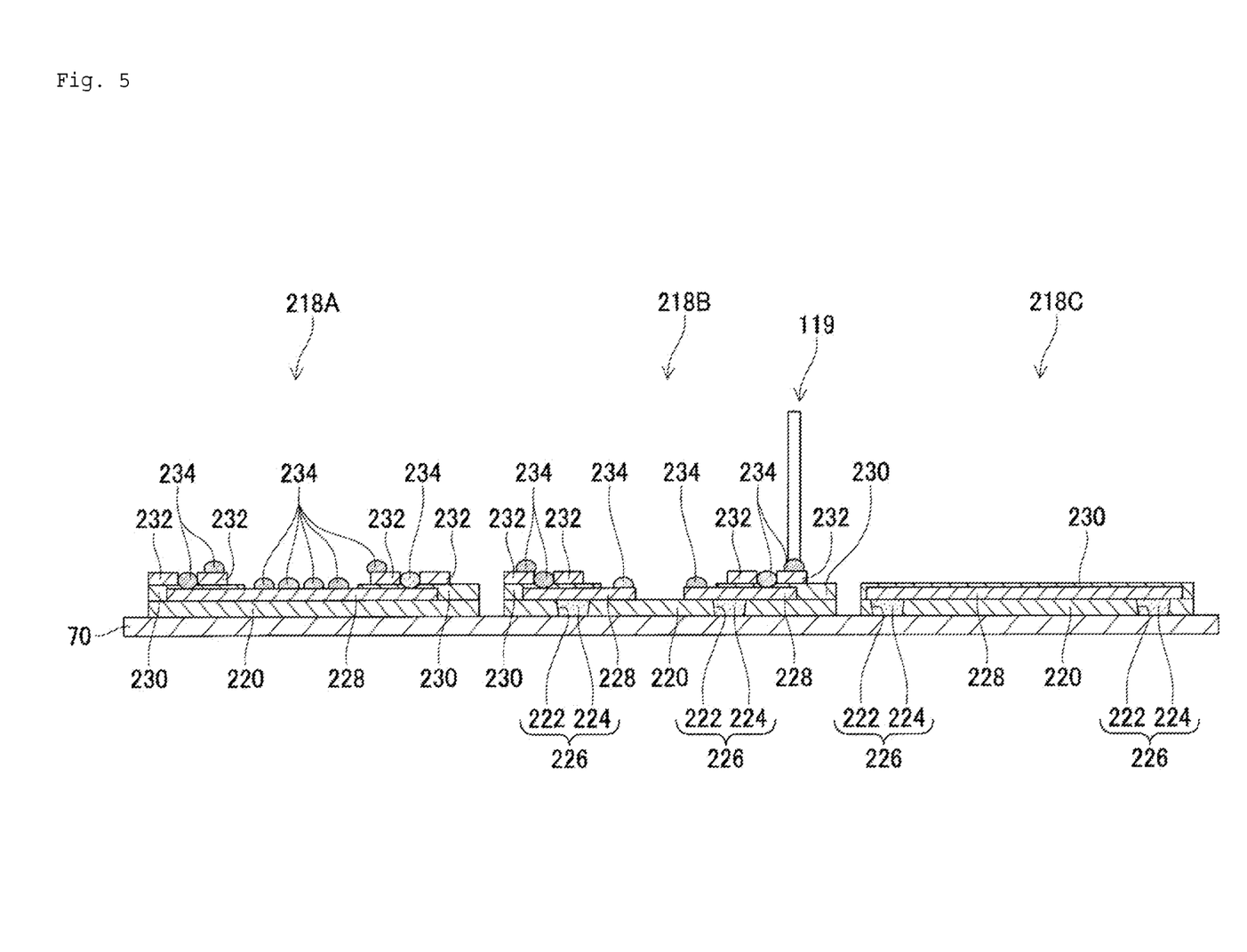
FIG. 5 is a cross-sectional view illustrating multiple multi-layer units formed on a base material.

First, in resin multi-layer forming step S10, as illustrated in FIG. 5, first resin layer 220 of multi-layer unit 218 is formed on base material 70. Therefore, base material 70 is set with respect to base 60. Stage 52 is moved below second forming unit 24. Thereafter, in second printing section 84, inkjet head 88 ejects the ultraviolet curable resin in a thin film shape onto the upper surface of base material 70. Subsequently, in curing section 86, flattening device 90 flattens the ejected ultraviolet curable resin such that the film thickness thereof becomes uniform. Further, irradiation device 92 irradiates the flattened ultraviolet curable resin with ultraviolet rays. Accordingly, the ultraviolet curable resin is cured. Thereafter, the ejection, the flattening, and the curing of the ultraviolet curable resin are repeated, so that first resin layer 220 is formed on base material 70 in multi-layer unit 218.

Resin multi-layer forming step S10 includes space forming step S12 (see FIG. 4). In space forming step S12, when the ejection, the flattening, and the curing of the ultraviolet curable resin are repeated, the inkjet head 88 ejects the ultraviolet curable resin such that a predetermined portion is exposed to the upper surface of base material 70 in a generally circular shape. Accordingly, multiple through-holes 222 are formed in resin layer 220 of each of multi-layer units 218B and 218C.

In conductive terminal forming step S20, stage 52 is moved below transfer unit 200. In transfer unit 200, first conductive adhesive 224 supplied in first adhesive supply device 206 is attached to a tip end of dip needle 119 of transfer head 210. Attached first conductive adhesive 224 is filled in each through hole 222 of resin layer 220 as transfer head 210 is moved by moving device 212. Accordingly, in resin layer 220 of each of multi-layer units 218B and 218C, first conductive adhesive 224 is transferred to each through hole 222. Thereafter, stage 52 is moved to curing section 86 of second forming unit 24. In curing section 86, irradiation device 92 irradiates transferred first conductive adhesive 224 with ultraviolet rays. Accordingly, in resin layer 220 of each of multi-layer units 218B and 218C, first conductive adhesive 224 in each through-hole 222 is cured to form each conductive terminal 226.

In circuit wiring forming step S30, stage 52 is moved below first forming unit 22. Thereafter, in first printing section 72, inkjet head 76 linearly ejects the metal ink onto the upper surface of resin layer 220 of multi-layer unit 218 according to a wiring circuit pattern. At this time, inkjet head 76 also ejects the metal ink onto the upper surface of conductive terminal 226 of each of multi-layer units 218B and 218C according to the wiring circuit pattern. Subsequently, in sintering section 74, laser irradiation device 78 irradiates the ejected metal ink with a laser beam. Accordingly, first circuit wiring 228 is formed on the upper surface of resin layer 220 of multi-layer unit 218 by sintering the metal ink. Circuit wiring 228 is also formed on the upper surface of conductive terminal 226 of each of multi-layer units 218B and 218C.

Thereafter, in the present embodiment, resin multi-layer forming step S10 and circuit wiring forming step S30 are repeated. Accordingly, second resin layer 230 and second circuit wiring 232 are formed in each of multi-layer units 218A and 218B. On the other hand, in multi-layer unit 218C, second resin layer 230 is formed.

Mounting step S40 includes transfer step S42 (see FIG. 4), mounting step S44 (see FIG. 4), and heating step S46 (see FIG. 4). In transfer step S42, stage 52 is moved below transfer unit 200. In transfer unit 200, second conductive adhesive 234 supplied in second adhesive supply device 208 is attached to a tip end of dip needle 119 of transfer head 210. Attached second conductive adhesive 234 is transferred to multiple predetermined positions in each of multi-layer units 218A and 218B as transfer head 210 moves by moving device 212. Any of transferred second conductive adhesive 234 is filled up to the through-hole of second resin layer 230 in a gap of second circuit wiring 232, so that second circuit wiring 232 and first circuit wiring 228 are electrically connected to each other.

Thereafter, above-described resin multi-layer forming step S10 is repeated. Accordingly, third resin layer 236 is formed in multi-layer unit 218 as illustrated in FIG. 6. In detail, in each of multi-layer units 218A and 218B, third resin layer 236 is formed on the upper surface of second resin layer 230 or the upper surface of second circuit wiring 232. At this time, space 240 is formed at planned mounting position 238 of each of multi-layer units 218A and 218B by space forming step S12. To the contrary, in multi-layer unit 218C, third resin layer 236 is formed on the upper surface of second resin layer 230. However, the upper surface of third resin layer 236 is not flattened, but is formed in a dome shape.

In mounting step S44, stage 52 is moved below mounting unit 26. In mounting unit 26, first electronic component 96 supplied by first tape feeder 110 is held by suction nozzle 118 of mounting head 112. As mounting head 112 moves by moving device 114, held first electronic component 96 is mounted in space 240 of multi-layer unit 218B, as illustrated in FIG. 7. At this time, each electrode 97 of first electronic component 96 is arranged to face the lower side with straddling a gap of first circuit wiring 228, and is connected to the upper surface of each circuit wiring 228 forming the gap via second conductive adhesive 234. In this way, second conductive adhesive 234 has a structure in which circuit wirings 228 forming the gap are electrically connected to each other via first electronic component 96. First electronic component 96 is separated from third resin layer 236 forming the wall surface of space 240. Further, the upper surface of first electronic component 96 is located below the upper surface of third resin layer 236.

In mounting unit 26, second electronic component 98 supplied by second tape feeder 111 is held by suction nozzle 118 of mounting head 112. Held second electronic component 98 is mounted in space 240 of multi-layer unit 218A as mounting head 112 moves by moving device 114. At this time, each electrode (not illustrated) of second electronic component 98 faces the lower side and is connected to the upper surface of first circuit wiring 228 via second conductive adhesive 234. Multiple second electronic components 98 are mounted in space 240 of multi-layer unit 218A. Each of second electronic components 98 is in a state of being separated from third resin layer 236 forming the wall surface of space 240. Further, the upper surface of each second electronic component 98 is located below the upper surface of third resin layer 236.

In mounting unit 26, probe pin 99 supplied from tray 201 is held by suction nozzle 118 of mounting head 112. Held probe pin 99 is mounted in space 240 of each of multi-layer units 218A and 218B as mounting head 112 moves by moving device 114. Accordingly, multiple probe pins 99 are mounted on respective multi-layer units 218A and 218B. A lower end of probe pin 99 is connected to the upper surface of second circuit wiring 232 via second conductive adhesive 234. An upper end of probe pin 99 is located above the upper surface of third resin layer 236.

Thereafter, in mounting step S44, stage 52 is moved below heating section 214. In heating section 214, irradiation device 216 irradiates infrared rays onto base material 70. Accordingly, in each of multi-layer units 218A, 218B, and 218C, first conductive adhesive 224 and second conductive adhesive 234 are cured, and first electronic component 96, second electronic component 98, and probe pins 99 are fixed.

(B-2) Unit Lay-Out Process

Unit lay-out process P12 includes unit peeling step S50 and unit lay-out step S60. In unit peeling step S50, base material 70 is melted by heat or a solvent. Accordingly, multi-layer units 218A, 218B, and 218C are separated from base material 70.

Figure 8:
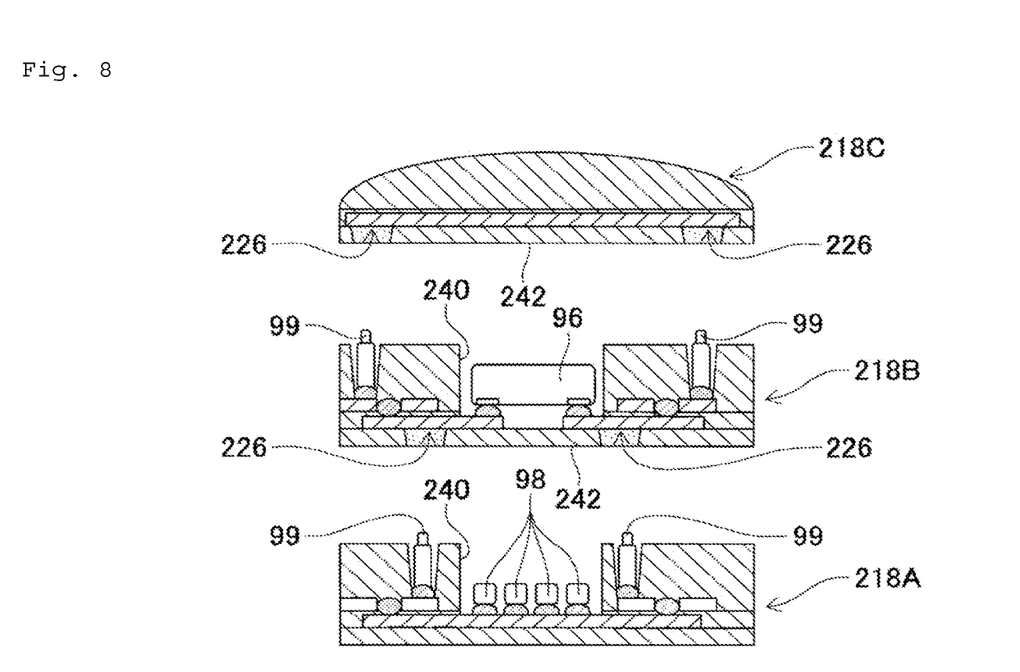
FIG. 8 is a cross-sectional view illustrating the multi-layer unit when being laid out in a vertical direction.
Figure 9:
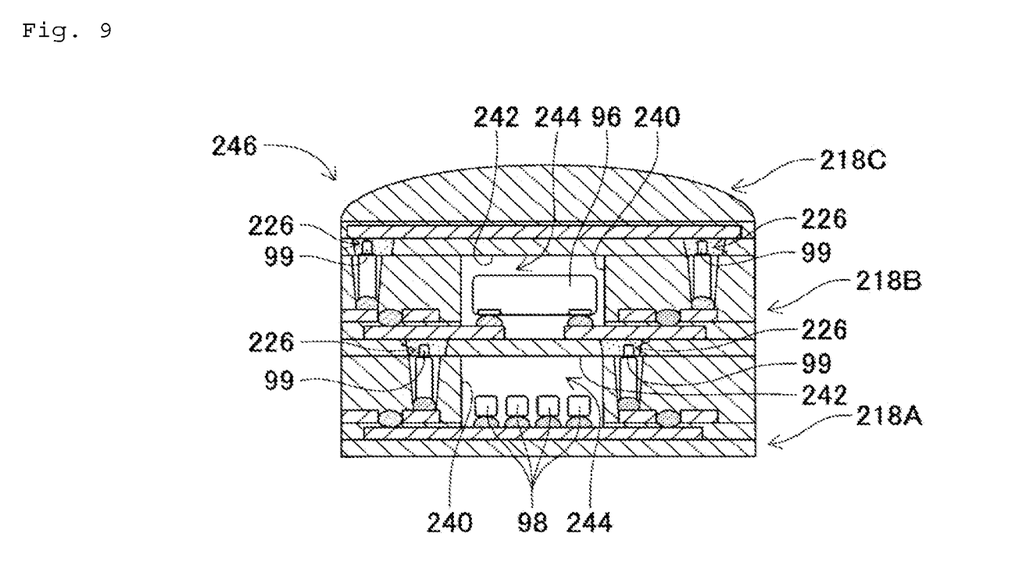
FIG. 9 is a cross-sectional view illustrating a three-dimensional multi-layer electronic device.

In unit lay-out step S60, as illustrated in FIG. 8, multi-layer units 218A, 218B, and 218C are laid out in the vertical direction. Accordingly, as illustrated in FIG. 9, each of multi-layer units 218A, 218B, and 218C is integrated into three-dimensional multi-layer electronic device 246.

In detail, intermediate multi-layer unit 218B is laid out on lower multi-layer unit 218A. At this time, the upper end portion of each probe pin 99 of lower multi-layer unit 218A is brought into contact with each conductive terminal 226 of intermediate multi-layer unit 218B, and is further inserted into each conductive terminal 226. Accordingly, lower multi-layer unit 218A is electrically connected to intermediate multi-layer unit 218B. Further, central space 240 of lower multi-layer unit 218A is closed by bottom surface 242 of intermediate multi-layer unit 218B. Accordingly, cavity portion 244 in which multiple second electronic components 98 are incorporated is formed in lower multi-layer unit 218A.

Upper multi-layer unit 218C is laid out on intermediate multi-layer unit 218B. At this time, the upper end portion of each probe pin 99 of intermediate multi-layer unit 218B is brought into contact with each conductive terminal 226 of upper multi-layer unit 218C, and is further inserted into conductive terminal 226. Accordingly, intermediate multi-layer unit 218B is electrically connected to upper multi-layer unit 218C. Further, central space 240 of intermediate multi-layer unit 218B is closed by bottom surface 242 of upper multi-layer unit 218C. Accordingly, cavity portion 244 in which first electronic component 96 is incorporated is formed in intermediate multi-layer unit 218B.

multi-layer units 218A, 218B, and 218C are integrated by a general method such as bonding, pressure bonding, or screw tightening (using an adhesive or a photocurable resin).

(C) Summary

As described in detail above, in method 130 of manufacturing a three-dimensional multi-layer electronic device, three-dimensional multi-layer electronic device 246 is manufactured, so that a tact time and a cycle time of the manufacturing can be shortened.

In the present embodiment, first electronic component 96, second electronic component 98, and probe pin 99 are examples of electronic components. Probe pin 99 is an example of a connection pin. Unit lay-out step S60 is an example of a cavity forming step. When multi-layer unit 218B is laid out on multi-layer unit 218A, multi-layer unit 218B is an example of an upper layer multi-layer unit, and multi-layer unit 218A is an example of a lower layer multi-layer unit. When multi-layer unit 218C is laid out on multi-layer unit 218B, multi-layer unit 218C is an example of an upper layer multi-layer unit, and multi-layer unit 218B is an example of a lower layer multi-layer unit.

(D) Modification Example

The present disclosure is not limited to the above-described embodiments, and various modification examples can be made without departing from the spirit thereof. For example, in unit forming process P10, multi-layer units 218A, 218B, and 218C are collectively formed on base material 70. However, multi-layer units 218A, 218B, and 218C may be formed on (base material 70 of) a separate multi-layer unit forming device 10.

Further, three-dimensional multi-layer electronic device 246 is configured by three multi-layer units 218, but may be configured by two or four or more multi-layer units. The number of multi-layer units constituting three-dimensional multi-layer electronic device 246 is determined from the viewpoint of the number of layers of circuit wiring, the number of connection layers of electronic components, the tact time, or the like.

Further, in intermediate multi-layer unit 218B, the upper surface of first electronic component 96 is located below the upper surface of third resin layer 236, but may be located above the upper surface of third resin layer 236. However, in such a case, when upper multi-layer unit 218C is laid out on intermediate multi-layer unit 218B on bottom surface 242 of upper multi-layer unit 218C, a space facing space 240 in which first electronic component 96 is mounted is formed, and an upper portion of first electronic component 96 is accommodated in the space.

Further, in formation of circuit wirings 228 and 232, sintering of the metal ink is performed by laser irradiation. However, the sintering of the metal ink may be performed collectively by a heating method using an electric furnace, an infrared heater, a hot plate or the like, depending on the type of the metal ink and a work size.

Further, first conductive adhesive 224 is cured by ultraviolet rays and heating and second conductive adhesive 234 is cured by heating. However, first conductive adhesive 224 and second conductive adhesive 234 may be cured by a laser, a flash lamp, or the like.

Further, in the above embodiment, it is possible to replace multi-layer unit 218B with a multi-layer unit in which an electronic component different from first electronic component 96 is incorporated, or replace multi-layer unit 218B with a multi-layer unit in which a circuit wiring of a wiring circuit pattern different from circuit wirings 228 and 232 is formed.

Figure 10:
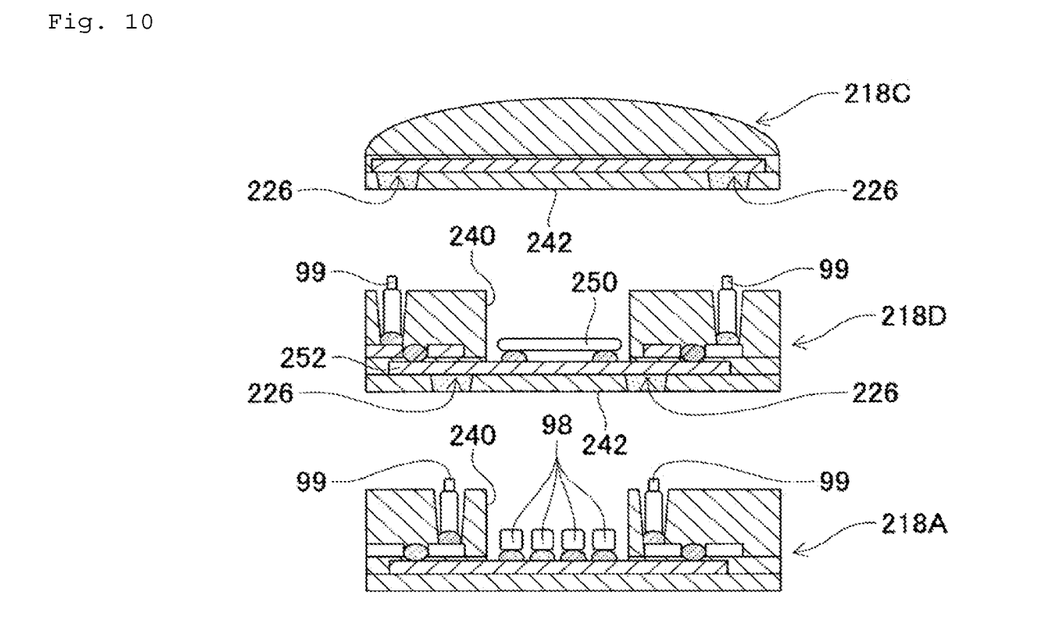
FIG. 10 is a cross-sectional view illustrating the multi-layer unit when being laid out in the vertical direction in a modification example.
Figure 11:
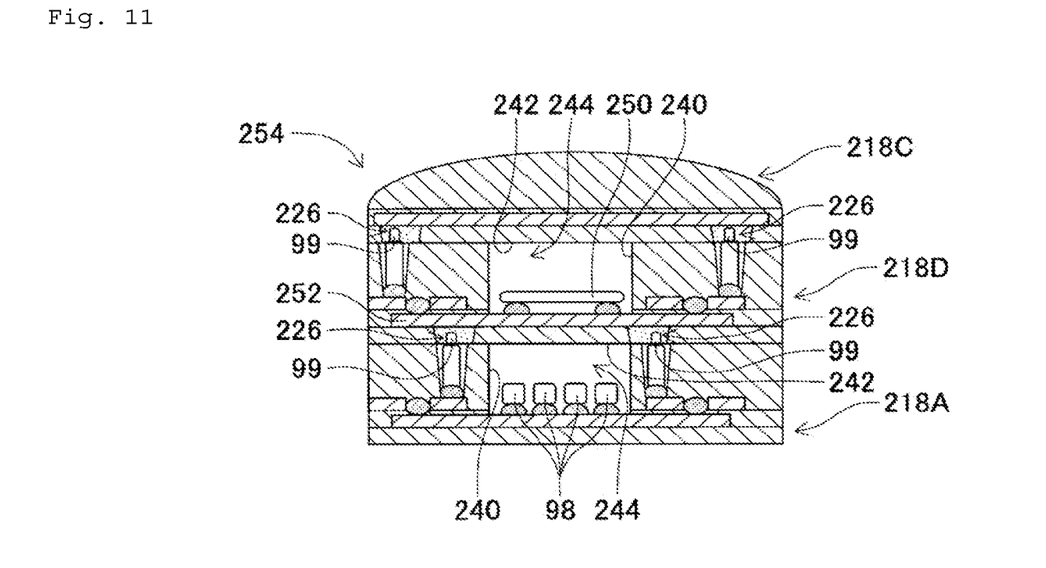
FIG. 11 is a cross-sectional view illustrating a three-dimensional multi-layer electronic device in the modification example.

In detail, for example, in unit lay-out step S60, instead of multi-layer unit 218B, multi-layer unit 218D illustrated in FIG. 10 may be integrated with multi-layer units 218A and 218C. Multi-layer unit 218D differs from multi-layer unit 218B at least in terms of third electronic component 250 accommodated in central space 240 and a wiring circuit pattern of first layer circuit wiring 252 on which third electronic component 250 is mounted. Accordingly, in method 130 of manufacturing a three-dimensional multi-layer electronic device, three-dimensional multi-layer electronic device 254 illustrated in FIG. 11, which is different from three-dimensional multi-layer electronic device 246 described above, is produced. Detailed description of multi-layer unit 218D will be omitted by attaching the same reference numerals to portions substantially common to those of multi-layer unit 218B in FIG. 10 and FIG. 11. Third electronic component 250 is an example of an electronic component.

This point is also applied to multi-layer unit 218A. Further, in the embodiment, multi-layer unit 218C can be replaced with a multi-layer unit in which a circuit wiring having a wiring circuit pattern different from that of circuit wiring 228 is formed.

REFERENCE SIGNS LIST

96 first electronic component, 98 second electronic component, 99 probe pin, 130 method of manufacturing three-dimensional multi-layer electronic device, 218 multi-layer unit, 226 conductive terminal, 228 circuit wiring, 232 circuit wiring, 238 planned mounting position, 240 space, 242 bottom surface of multi-layer unit, 244 cavity portion, 246 three-dimensional multi-layer electronic device, 250 third electronic component, 252 circuit wiring, 254 three-dimensional multi-layer electronic device, P10 unit forming process, P12 unit lay-out process, S12 space forming step, S20 conductive terminal forming step, S40 mounting step, S60 unit lay-out step

The invention claimed is:

1. A method of manufacturing a three-dimensional multi-layer electronic device, comprising:
   a unit forming process of forming multi-layer units including an electronic component and a circuit wiring by three-dimensional lay-out forming, each of the multi-layer units including a first resin layer formed on a base material; and
   a unit lay-out process of manufacturing a three-dimensional multi-layer electronic device by separating the first resin layer of each of the multi-layer units from the base material and laying out the multi-layer units integrally in a vertical direction.

2. The method of manufacturing a three-dimensional multi-layer electronic device according to claim 1,
   wherein the unit forming process includes:
   a space forming step of forming a space in which the electronic component is configured to be accommodated at a planned mounting position of the electronic component; and
   a mounting step of mounting the electronic component in the space, and wherein the unit lay-out process includes:
   a cavity forming step of forming a cavity portion by closing the space by a bottom surface of an upper multi-layer unit.

3. The method of manufacturing a three-dimensional multi-layer electronic device according to claim 1,
wherein the unit forming process includes:
a conductive terminal forming step of forming in an upper multi-layer unit of the multi-layer units a conductive terminal for electrical connection to a lower multi-layer unit when the multi-layer units are laid out in the vertical direction, and
wherein the electronic component includes:
a connection pin that extends above an upper surface of the lower multi-layer unit for electrical connection to the conductive terminal of the upper multi-layer unit when the multi-layer units are laid out in the vertical direction.

4. The method of manufacturing a three-dimensional multi-layer electronic device according to claim 1,
wherein in the unit lay-out process, at least one of the multi-layer units to be integrally laid out in the vertical direction is a shared multi-layer unit, so that a multi-layer unit other than the shared multi-layer unit is replaced with a multi-layer unit including a second electronic component different from the electronic component or a second circuit wiring having a pattern different from that of the circuit wiring, by which a three-dimensional multi-layer electronic device differed from the three-dimensional multi-layer electronic device is manufactured.

5. The method of manufacturing a three-dimensional multi-layer electronic device according to claim 1, wherein
the base material is a common base material on which the first resin layer of each of the multi-layer units is formed, and
the base material is melted prior the multi-layer units being separated from the base material.

* * * * *